United States Patent
Higashiyama

(10) Patent No.: US 7,398,852 B2
(45) Date of Patent: Jul. 15, 2008

(54) NOISE-RESISTANT CIRCUIT AND APPARATUS USING SAME

(75) Inventor: Yoji Higashiyama, Chiryu (JP)

(73) Assignee: DENSO CORPORATION, Kariya (JP)

( * ) Notice: Subject to any disclaimer, the term of this patent is extended or adjusted under 35 U.S.C. 154(b) by 403 days.

(21) Appl. No.: 10/780,725

(22) Filed: Feb. 19, 2004

(65) Prior Publication Data
US 2004/0164534 A1   Aug. 26, 2004

(30) Foreign Application Priority Data
Feb. 24, 2003   (JP) .............................. 2003-045914

(51) Int. Cl.
  *B60K 28/12* (2006.01)
  *B60K 28/14* (2006.01)
(52) U.S. Cl. ...................... 180/282; 280/734; 280/735; 701/45
(58) Field of Classification Search ................. 280/734, 280/735; 180/271, 282; 701/45; 707/10.1
See application file for complete search history.

(56) References Cited

U.S. PATENT DOCUMENTS

| | | | | |
|---|---|---|---|---|
| 5,083,276 | A | * | 1/1992 | Okano et al. ................... 701/46 |
| 5,176,214 | A | * | 1/1993 | Taufer et al. .................. 180/268 |
| 5,182,459 | A | * | 1/1993 | Okano et al. ................. 307/10.1 |
| 5,636,863 | A | * | 6/1997 | Reid et al. .................... 280/735 |
| 5,890,084 | A | | 3/1999 | Halasz et al. |
| 6,037,674 | A | * | 3/2000 | Hargedon et al. ........... 307/10.1 |
| 6,147,417 | A | | 11/2000 | Ueno |
| 6,218,738 | B1 | * | 4/2001 | Fujishima ................... 307/10.1 |
| 6,373,147 | B1 | * | 4/2002 | Miyaguchi et al. ......... 307/10.1 |
| 6,465,907 | B2 | * | 10/2002 | Ueno et al. ................. 307/10.1 |
| 6,504,264 | B2 | * | 1/2003 | Ueno et al. ................. 307/10.1 |
| 6,555,933 | B2 | * | 4/2003 | Cook et al. ................. 307/10.1 |
| 7,084,763 | B2 | * | 8/2006 | Shieh et al. .................. 340/561 |
| 7,121,376 | B2 | * | 10/2006 | Baumgartner et al. ....... 180/282 |
| 7,137,645 | B2 | * | 11/2006 | Schumacher et al. ........ 280/735 |

FOREIGN PATENT DOCUMENTS

| | | |
|---|---|---|
| JP | A-UM-H02-005371 | 1/1990 |
| JP | A-H08-175315 | 7/1996 |
| JP | 9-240416 | 9/1997 |
| JP | 11-34791 | 2/1999 |
| JP | A-H11-059324 | 3/1999 |
| JP | A-H11-245762 | 9/1999 |
| JP | 2001-505151 | 4/2001 |
| JP | A-2002-347569 | 12/2002 |
| JP | 2003-2158 | 1/2003 |

OTHER PUBLICATIONS

Notification for Reasons of Rejection and its translation in corresponding Japanese application No. 2003-045914 dated Jul. 24, 2007.

* cited by examiner

*Primary Examiner*—Toan C To
(74) *Attorney, Agent, or Firm*—Posz Law Group, PLC

(57) ABSTRACT

An airbag apparatus for safety includes an airbag inflating in response to a signal, and a sensor sensing a movement and generating the signal in response to the movement. A controller is configured to issue a command for squibbing a squib based on the signal. The airbag apparatus also includes a plurality of drivers operating in response to the command and a plurality of independent channels connecting the controller and the drivers to transmit the command from the controller to the drivers and a plurality of switching elements to squib the squib for inflating the airbag, for example, in a vehicle.

5 Claims, 5 Drawing Sheets

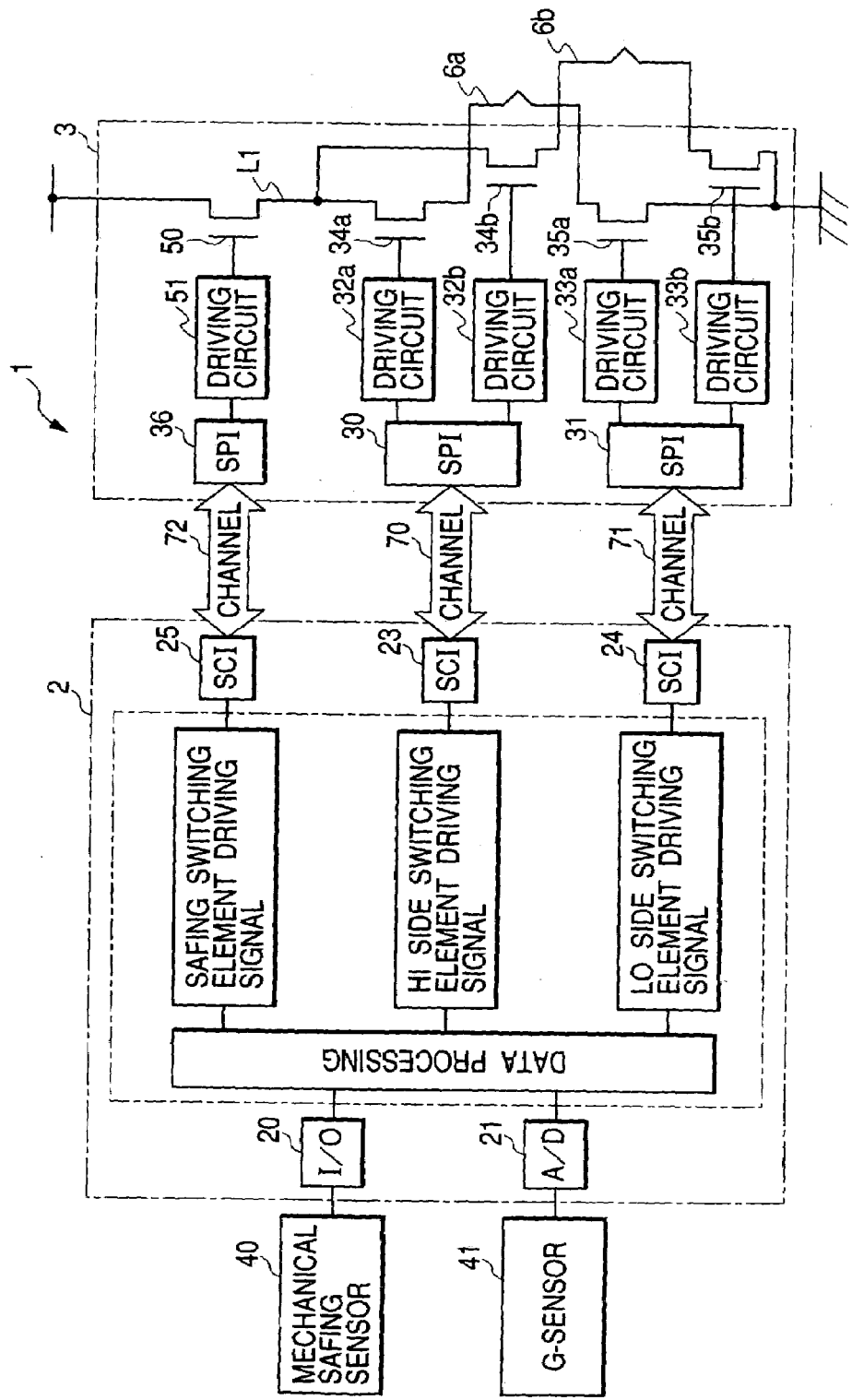

NOISE-RESISTANT CIRCUIT AND APPARATUS USING SAME

BACKGROUND OF THE INVENTION

1. Technical Field of the Invention

The present invention relates generally to an on-vehicle airbag system for protecting occupants by inflating an airbag in a car upon collision.

2. Background Art

Cars are essential to modem life, and an airbag has also become essential for protecting an occupant. A circuitry of a related airbag system (Japanese Patent First Publication No. 9-240416) is shown in FIG. 1. As shown, the airbag system 100 comprises a Cpu (Central Processing Unit) 101, am IC (Integral Circuit) 102 having a first switching element 106 and a second switching element 107, a mechanical sating sensor 103, an acceleration sensor 104 (hereinafter, simply referred to as "G-sensor"), a safing switching element 105, and a squib 120.

A series of operation procedures upon collision is described below. A signal from the mechanical safing sensor 103 is sent to the CPU 101 through an I/O circuit 108. If the CPU decides to choose ON, an approval signal is issued, and sent to an AND gate 110 through a signal line L100. The approval signal is also sent to an AND gate 111 through a signal line L101.

On the other hand, a detected signal from the G-sensor 104 is sent to the CPU 101 through an A/D (Analog to Digital) converter 109. If the CPU 101 chooses to squib, a driving signal is issued and sent to the AND gate 111 through a signal line L102. If both of the driving signal and the approval signal are sent to the AND gate 111, an AND signal is sent to a SCI (Serial Communication Interface) 112 from the AND gate 111. The AND signal is sent to the SPI (Serial Parallel Interface) 113 through a serial transmission channel 119, and the AND signal is sent to the AND gate 110 through a signal line L104. If both of the AND signal and the approval signal are sent to the AND gate 110, a safing switching element 105 is activated.

The driving signal is also sent to a SCI 114 through a signal line L103. The driving signal is sent to a SPI 116 in the IC 102 through a serial transmission channel 115. The driving signal from the SPI 116 is sent to a driving circuit 117 through a signal line L105. The first switching element 106 is driven by the driving circuit 117. The driving signal from the SPI 116 is also sent to a driving circuit 118 through a signal line L106. The second switching element 107 is driven by the driving circuit 118. If the safing switching element 105, the first switching element 106, and the second switching element 107 are all driven (that is, all of the elements are made ON), an electric current flows in an electric power line L107. A squib 120 generates heat on account of the electric current, and an inflator is fired up, resulting in inflation of an airbag in a car.

However, the airbag system 100 has only one channel 115 to connect the CPU 101 and the switching elements 106 and 107 in the IC 102. (The channel 119 connects only the CPU 101 and the AND gate 110.)

Because there is only one channel 115, if the channel 115 is effected by, for example, an external noise, it is likely to cause a problem on both of the first switching element 106 and the second switching element 107 simultaneously. Thus, an operation reliability of the airbag system is low.

SUMMARY OF THE INVENTION

An airbag system of the present invention has been developed considering the above issue in the background art. A purpose of the present invention is to offer the airbag system with a high operational reliability against, for example, an external noise.

In order to accomplish the above object, as one aspect of the present invention, there is provided a circuit configured to activate an actuator comprising: a sensor sensing a predetermined physical event to provide a signal indicative of the event; a controller responsive to the signal inputted from the sensor to output actuator activating signals; a plurality of switch drivers responsive to the actuator activating signals outputted from the controller to produce switch on-signals, respectively; a plurality of independent channels each of which connects the controller to one of the switch drivers to transmit the actuator activating signals from the controller to the switch drivers, respectively; and a plurality of switches designed to be turned on in response to the switch on-signals produced by the switch drivers, respectively, the switches being so connected in series with each other that when the switches are all turned on, an actuator turning on-signal being provided to activate the actuator.

Preferably, the actuator is a squib for inflating an airbag mounted on a vehicle.

As a second aspect of the present invention, there is provided an airbag apparatus for safety comprising: an airbag inflating in response to a signal; a sensor sensing a movement and generating the signal in response to the movement; a controller configured to issue a command for squibbing the squib based on the signal; a plurality of drivers operating in response to the command; a plurality of independent channels connecting the controller and the plurality of drivers to transmit the command from the controller to the plurality of drivers; and a plurality of switching elements, mutually connected in series and driven by the plurality of drivers respectively, to squib the squib.

The above configurations of the present invention can be reduced into practice as follows.

An airbag system of the present invention is characterized by comprising a CPU, an IC having a plurality of switching elements for squibbing a squib in response to a command of the CPU, and a plurality of independent channels connecting the CPU and the IC independently, for informing the command of the CPU to the plurality of switching elements for squibbing the squib.

Briefly, the airbag system of the present invention comprises a plurality of channels. In the airbag system of the present invention, if one of the channels is effected by an external noise, a problem is caused only on the switching element which is informed of a squibbing command through the channel which is effected by the external noise. In other words, the problem is not caused on the switching element connected to the other channel. As a result, a probability for causing the problem on all of the switching elements simultaneously becomes low. Because of the above reason, the airbag system of the present invention has a high operational reliability against, for example, an external noise.

Optimally, the plurality of channels are a type of serial transmission system for giving the squibbing command. In other words, all of the channels of the present invention are the type of serial transmission system. Interconnection of the serial transmission system is simpler than that of a parallel transmission system. This means that a circuitry of the serial transmission system becomes simpler than that of the parallel transmission system.

Optimally, the plurality of channels comprises a HI side (potentially high side) channel and a LO side (potentially low side) channel. The HI side channel is connected to a higher voltage side of an electric power line for a squib, and the LO side channel is connected to a lower voltage side of it. A signal inputted from a sensor is processed by the CPU based on predetermined programs. A HI side switching element driving signal with high voltage and a LO side switching element driving signal with low voltage are issued based on a result of processing carried out by the CPU. The HI side switching element driving signal transmits in the HI side channel, and drives the switching element connected electrically to the HI side channel. Also, the LO side switching element driving signal transmits in the LO side channel, and drives the switching element connected electrically to the LO side channel. With the above composition, a high operation reliability is realized even though the circuitry is simple in its configuration and the signal processing is also simple.

Optimally, at least, one of the HI side channel and the LO side channel has a plurality of routes for driving the plurality of switching elements in the above configuration.

With the above composition, the plurality of switching elements can be driven by the one channel. As a result, the circuitry becomes simple if a plurality of airbags are set, for example, in front of a driver's seat, to the side of the driver's seat, in front of a passenger's seat and to the side of the passenger's seat.

Also, the HI side channel and the LO side channel are independent of each other in this configuration. Thus, a high operation reliability is realized even if the channel is effected by, for example, an external noise.

Embodiments of the airbag system of the present invention are shown below.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiment but are for the purpose of explanation and understanding only.

In the drawings:

FIG. 5 is a block diagram showing an airbag system of a fourth embodiment of the present invention.

DETAILED DESCRIPTION OF THE PREFERRED EMBODIMENTS

First Embodiment

Figure 1:
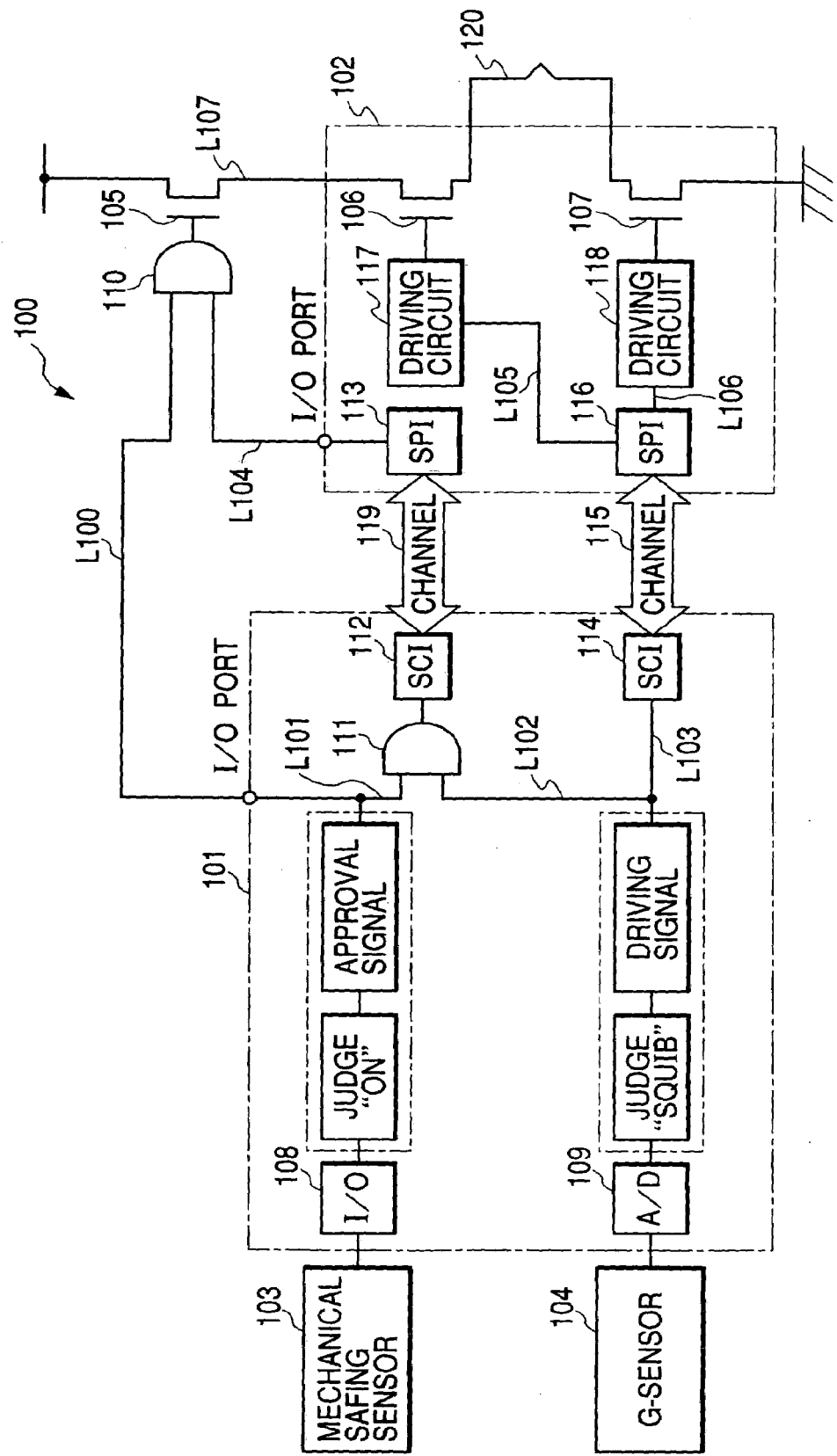
FIG. 1 is a circuit diagram of a conventional airbag system.
Figure 2:
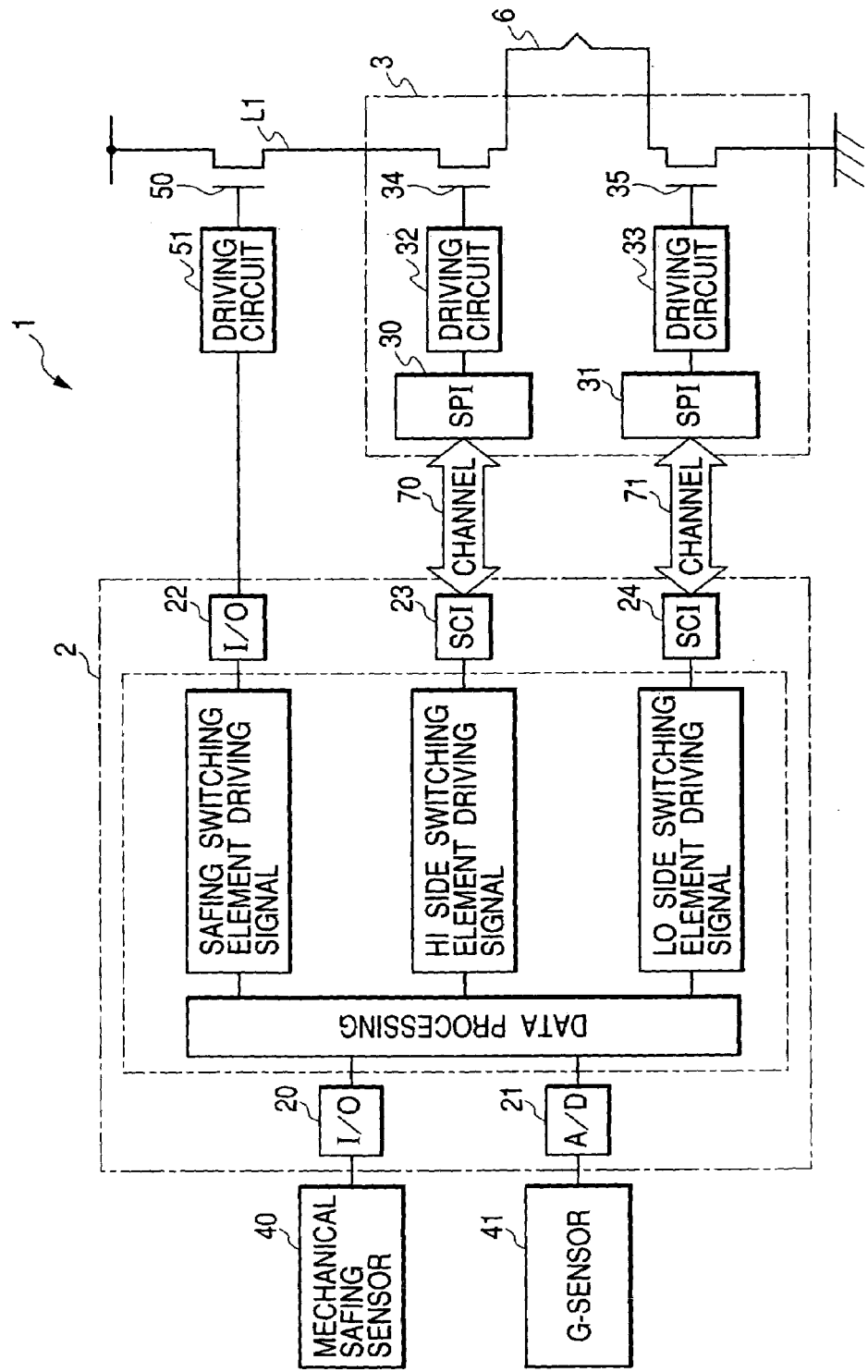
FIG. 2 is a block diagram showing an airbag system of a first embodiment of the present invention.

First, an arrangement of an airbag system of a first embodiment for automobile application will now be described. A block diagram of the airbag system of the first embodiment is shown in FIG. 2. As shown in FIG. 2, the airbag system 1 comprises a CPU 2, an IC 3, a mechanical safing sensor 40, a G-sensor 41, a safing switching element 50, and a squib 6.

The CPU 2 includes a first I/O circuit 20, an A/D converter 21, a second 110 circuit 22, a HI side (potentially high side) SCI 23, and a LO side (potentially low side) SCI 24. The first I/O circuit 20 is connected to the mechanical safing sensor 40. The A/D converter 21 is connected to the electrical G-sensor 41. The second I/O circuit 22 is connected to a safing switching element driving circuit 51 which drives a safing switching element 50.

The IC 3 includes a HI side SPI 30, a LO side SPI 31, a HI side driving circuit 32, a LO side driving circuit 33, a HI side switching element 34, and a LO side switching element 35. The HI side SPI 30, the HI side driving circuit 32 and the HI side switching element 34 are connected in series to each other. The LO side SPI 31, the LO side driving circuit 33 and the LO side switching element 35 are also connected in series to each other.

The HI side SCI 23 is connected to the HI side SPI 30 by a HI side serial transmission channel 70. The LO side SCI 24 is connected to the LO side SPI 31 by a LO side serial transmission channel 71.

The channels 70 and 71 are signal lines made of wires, respectively. The each channel includes the wire and ports located at the both ends of the wire, that is, the SCI and SPI. A wireless channel using electromagnetic waves or rays is also possible.

The safing switching element 50, the HI side switching element 34, and the LO side switching element 35 are connected in series by an electric power line L1. A squib 6 is positioned between the HI side switching element 34 and the LO side switching element 35. The squib 6 has a role of inflating an airbag mounted in front of the driver's seat.

An operating procedure of the airbag system upon collision in the first embodiment will now be described. A signal from the mechanical safing sensor 40 is inputted to the CPU 2 through the first I/O circuit 20. Alternatively, a signal from the G-sensor 41 is inputted to the CPU 2 through the A/D converter 21.

These signals are processed by the CPU 2 with predetermined programs. If the result of the processing carried out by the CPU 2 meets a predetermined condition, a safing switching element driving signal, a HI side switching element driving signal, and a LO side switching element driving signal are issued.

The safing switching element driving signal is sent to the safing switching element driving circuit 51 through the second I/O circuit 22. If the safing switching element driving circuit 51 receives the safing switching element driving signal, the circuit 51 drives the switching element 50.

The HI side switching element driving signal is sent to the HI side driving circuit 32 through the HI side SCI 23, the HI side channel 70, and the HI side SPI 30. If the HI side driving circuit 32 receives the HI side switching element driving signal, the circuit 32 drives the switching element 34.

The LO side switching element driving signal is sent to the LO side driving circuit 33 through the LO side SCI 24, the LO side channel 71, and the LO side SPI 31. If the LO side driving circuit 33 receives the LO side switching element driving signal, the circuit 33 drives the switching element 35.

If the safing switching element 50, the HI side switching element 34, and the LO side switching element 35 are driven, that is, the all elements are made ON, an electric current flows in the electric power line L1. Thus, the squib 6 is caused to generate heat by the current and then, an inflator is fired up, resulting in inflation of the airbag in the automobile.

Advantages of the airbag system of this embodiment can be described as below. In the case of airbag system 1 of this embodiment, if the HI side channel 70, that is, one of the HI side channel 70 and the LO side channel 71, is effected by an external noise, a problem resulting from the noise is caused only on the HI side switching element 34. However, such a problem is not caused on the LO side switching element 35.

This means that a probability of simultaneously occurring problem on both of the HI side switching element 34 and the LO side switching element 35 is low. Because of this reason, a high operational reliability of the airbag system 1 of this embodiment is realized even if the airbag system 1 receives, for example, an external noise. The airbag system 1 of this embodiment uses the serial transmission system for both the HI side channel and the LO side channel, resulting in a simple circuitry of the airbag system 1.

Second Embodiment

Figure 3:
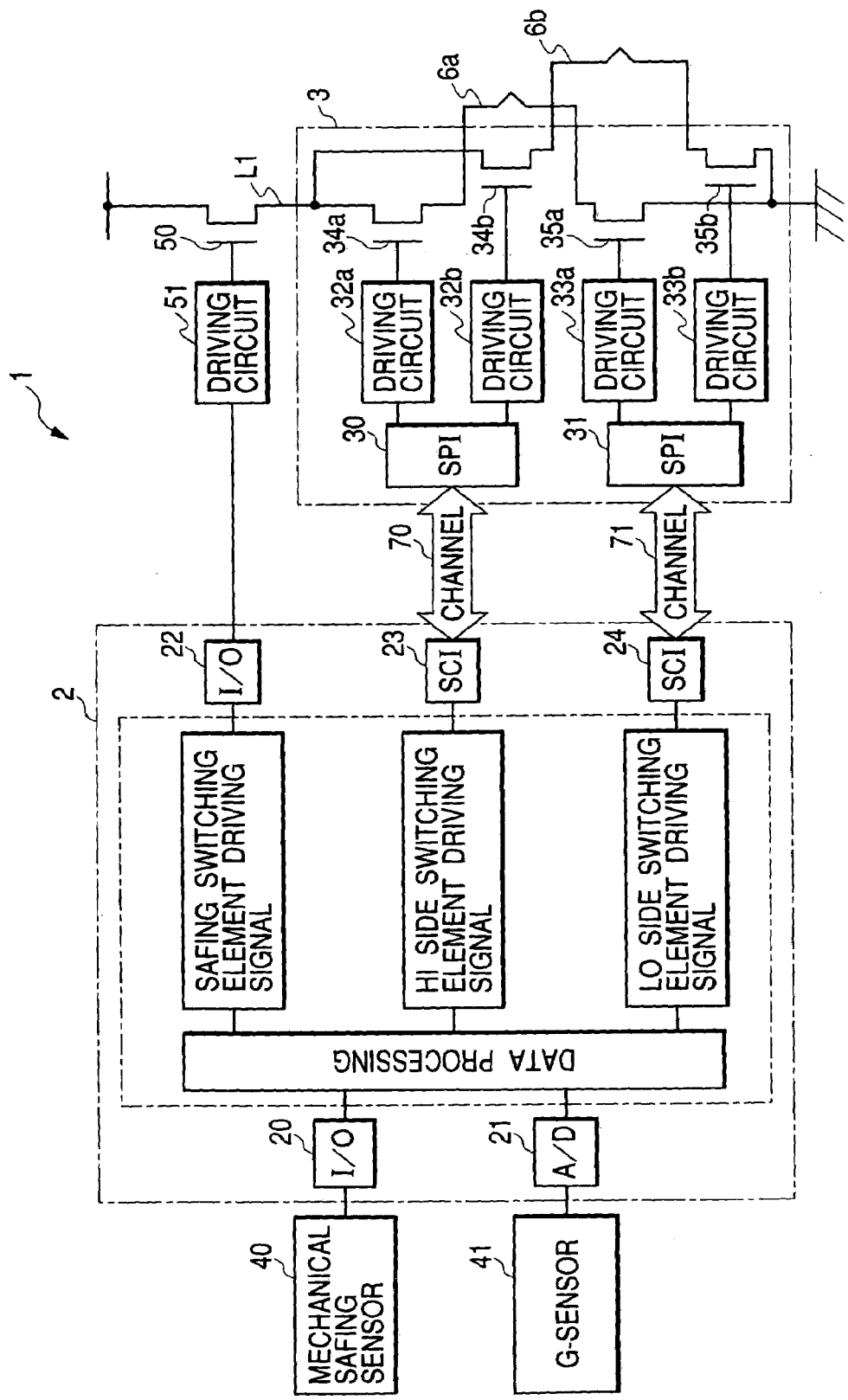
FIG. 3 is a block diagram showing an airbag system of a second embodiment of the present invention.

Referring to FIG. 3, an airbag system of a second embodiment according to the present invention will now be described. The difference between the first embodiment and the second embodiment is that the second embodiment includes two squibs contrasted with the single squib in the first embodiment. Accordingly, an IC includes two HI side (potentially high side) switching elements and two LO side (potentially low side) switching elements. Thus, only different points from the first embodiment will be described below.

A circuitry of an airbag system of the second embodiment is shown in FIG. 3. Components corresponding to those of the first embodiment are shown with the same reference numbers in the first embodiment.

An IC 3 includes a HI side SPI 30, a LO side SPI 31, a HI side first driving circuit 32a, a HI side second driving circuit 32b, a LO side first driving circuit 33a, a LO side second driving circuit 33b, a HI side first switching element 34a, a HI side second switching element 34b, a LO side first switching element 35a, and a LO side second switching element 35b. The HI side SPI 30, the HI side first driving circuit 32a, and the HI side first switching element 34a are connected in series to each other. The HI side SPI 30, the HI side second driving circuit 32b, and the HI side second switching element 34b are also connected in series to each other. The LO side SPI 31, the LO side first driving circuit 33a, and the LO side first switching element 35a are connected in series to each other. The LO side SPI 31, the LO side second driving circuit 33b, and the LO side second switching element 35b are also connected in series to each other. A squib 6a is positioned between the HI side first switching element 34a and the LO side first switching element 35a. The squib 6a has a role of inflating an airbag set in front of the driver's seat. A squib 6b is positioned between the HI side second switching element 34b and the LO side second switching element 35b. The squib 6b has a role of inflating an airbag set in front of a passenger's seat.

If a safing switching element 50 is driven, and if the HI side first switching element 34a is driven by the HI side first driving circuit 32a, and also if the LO side first switching element 35a is driven by the LO side first driving circuit 33a, an electric current flows in a electric power line L1. The squib 6a generates heat by the electric current, and then, an inflator is fired up, resulting in inflation of the airbag in the automobile.

Also, if the safing switching element 50 is driven, and if the HI side second switching element 34b is driven by the HI side second driving circuit 32b, and also if the LO side second switching element 35b is drived by the LO side second driving circuit 33b, an electric current flows in the electric power line L1. The squib 6b generates heat by the electric current, and an inflator is fired up, resulting in inflation of the airbag in the automobile.

The airbag system 1 of the second embodiment has identical advantages to that of the first embodiment. If the HI side channel 70, that is, one of the HI side channel 70 and the LO side channel 71, is effected by an external noise, a problem resulting from the noise is caused only on the HI side first switching element 34a and the HI side second switching element 34b. However, the problem is not caused on the LO side first switching element 35a and the LO side second switching element 35b. This means that a probability of the problem occurrence on both of the HI side first switching element 34a and the LO side first switching element 35a simultaneously is low. Also, a probability of the simultaneous problem occurrence on both of the HI side second switching element 34b and the LO side second switching element 35b is low. Because of the above reasons, a high operational reliability of the airbag system 1 of this embodiment is realized even if the airbag system 1 receives, for example, an external noise.

In the airbag system 1 of this embodiment, the HI side first switching element 34a and the HI side second switching element 34b are driven by the HI side channel 70. Also, the LO side first switching element 35a and the LO side second switching element 35b are driven by the LO side channel 71. Accordingly, a circuitry of this embodiment becomes simple compared with a configuration in which each switching element has its own channel.

Third Embodiment

Figure 4:
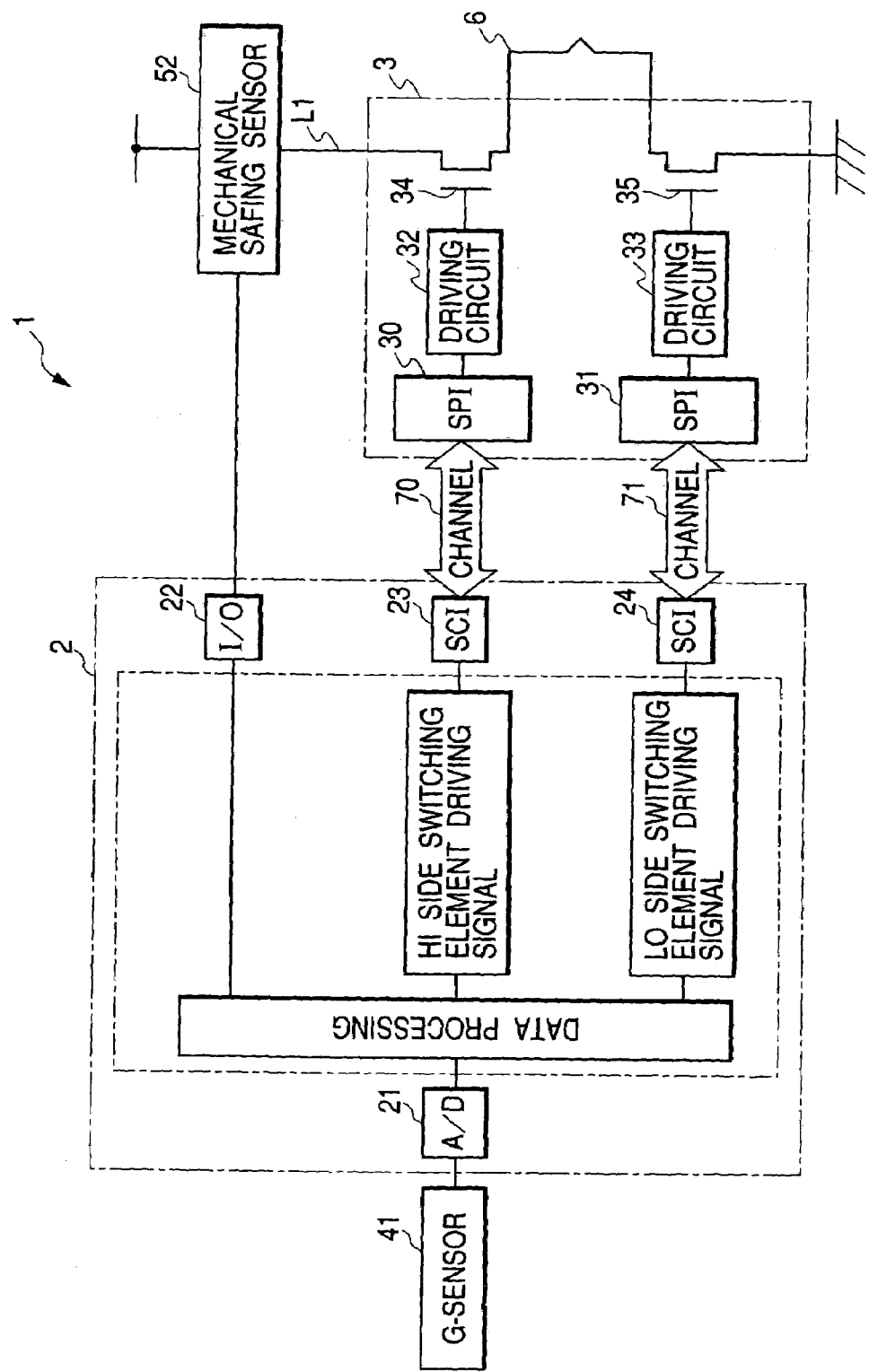
FIG. 4 is a block diagram showing an airbag system of a third embodiment of the present invention.

Referring to FIG. 4, an airbag system of a third embodiment according to the present invention will be described. The difference between the first embodiment and the third embodiment is that the third embodiment has a mechanical safing sensor instead of both the safing switching element and the safing switching element driving circuit adopted in the first embdiment. Thus, only different points from the first embodiment will be described below.

A circuitry of an airbag system of the third embodiment is shown in FIG. 4. Components corresponding to those of the first embodiment are shown with the same reference numbers in the first embodiment.

As shown in FIG. 4, the mechanical safing sensor 52 is connected to a HI side (potentially high side) switching element 34 and a LO side (potentially low side) switching element 35 in series to each other through an electric power line L1. A signal from the mechanical safing sensor 52 is sent to a CPU 2 through a second I/O circuit 22.

The airbag system 1 of the third embodiment has identical advantages to that of the first embodiment. Also, a circuitry of the CPU 2 for the airbag system 1 of the third embodiment becomes simple.

Fourth Embodiment

Referring to FIG. 5, an airbag system of a fourth embodiment according to the present invention will now be described. The difference between the second embodiment and the fourth embodiment is that a safing switching element of the fourth embodiment is positioned in an IC. Thus, only different points from the second embodiment will be described below.

A circuitry of an airbag system according to the fourth embodiment is shown in FIG. 5. Components corresponding to those of FIG. 3 are shown with the same reference numbers of FIG. 3.

As shown in FIG. 5, a safing switching element driving signal is sent to a safing switching element driving circuit 51 through a safing SCI 25, a serial transmission channel 72, and a safing SPI 36. A safing switching element 50 is driven by the safing switching element driving circuit 51.

An airbag system 1 of the fourth embodiment has identical advantages to that of the first embodiment. Also, in the fourth embodiment, all of the switching elements are positioned in an IC 3, reducing assembly space in the airbag system 1.

Modifications

The present invention may be embodied in other specific forms without departing from the spirit or essential characteristics of it. The present embodiments are therefore to be considered in all respects as illustrative and not restrictive, the scope of the present invention being indicated by the appended claims rather than by the foregoing description and all changes which come within the meaning and range of equivalency of the claims are therefore intended to be embraced therein.

The various embodiments of the airbag system have been explained. However, composition and configuration of the embodiment that can be adopted by the present invention are not limited to those explained in the above. It is possible for a person skilled in the art to implement many other modified, or improved embodiments.

For example, there is no limitation in the number of squibs. The number of the squibs will depend on the number of airbags. It is possible to increase the number of switching elements connected to the HI side channel 70 and the LO side channel 71 respectively.

In addition, the airbag system of the present invention is applicable to many kinds of vehicles such as automobiles, motorbikes, carriages at amusement parks, and trains and airplanes.

What is claimed is:

1. A noise-resistant circuit for squibbing a squib mounted on an object to be moved,
    said circuit comprising:
        a sensor sensing a physical quantity applied to the circuit to generate a signal corresponding to the applied physical quantity;
        a controller configured to issue a command for squibbing the squib based on the signal;
        a plurality of independent channels connecting the controller and a plurality of drivers to transmit the command from the controller to the plurality of drivers, the plurality of independent channels comprising a first channel and a second channel, the first channel being connected to a higher voltage electric power line of the squib and the second channel being connected to a lower voltage electric power line of the squib; and
        a plurality of switching elements, mutually connected in series and driven, by the plurality of drivers respectively, to squib the squib.

2. A noise-resistant circuit as claimed in claim 1, wherein, at least one of the first channel and the second channel is in charge of transmitting the command for driving two or more switching elements among the plurality of switching elements.

3. An airbag apparatus for safety comprising:
    an airbag inflating in response to a signal;
    a sensor sensing a movement and generating the signal in response to the movement;
    a controller configured to issue a command for squibbing the squib based on the signal;
    a plurality of drivers operating in response to the command;
    a plurality of independent channels connecting the controller and a plurality of drivers to transmit the command from the controller to the plurality of drivers, the plurality of the independent channels comprising a first channel and a second channel, the first channels being connected to a higher voltage electric power line of the squib and the second channel being connected to a lower voltage electric power line of the squib; and
    a plurality of switching elements, mutually connected in series and driven by the plurality of drivers respectively, to squib the squib.

4. An airbag apparatus for safety as claimed in claim 3, wherein at least one of the first channel and the second channel is in charge of transmitting the command for driving two or more switching elements among the plurality of switching elements.

5. An airbag apparatus for safety as claimed in claim 3, wherein the apparatus comprises a plurality of squibs the first channels being connected to higher voltage electric power lines of the plurality of squibs, the second channels being connected to lower voltage electric power lines of the plurality of squibs.

* * * * *